(12) United States Patent
Hamley

(10) Patent No.: US 7,545,216 B2
(45) Date of Patent: Jun. 9, 2009

(54) AMPLIFIER WITH CURRENT MIRROR BIAS ADJUST

(76) Inventor: James Pearce Hamley, 2922 S. Cottonwood Pl. SE., Mill Creek, WA (US) 98012

( * ) Notice: Subject to any disclaimer, the term of this patent is extended or adjusted under 35 U.S.C. 154(b) by 65 days.

(21) Appl. No.: 12/001,053

(22) Filed: Dec. 10, 2007

(65) Prior Publication Data

US 2008/0136522 A1 Jun. 12, 2008

Related U.S. Application Data

(60) Provisional application No. 60/874,200, filed on Dec. 12, 2006.

(51) Int. Cl.
*H03F 3/45* (2006.01)
(52) U.S. Cl. .................. 330/261; 330/257; 330/267
(58) Field of Classification Search .............. 330/261, 330/257, 267
See application file for complete search history.

(56) References Cited

U.S. PATENT DOCUMENTS

| | | | | |
|---|---|---|---|---|
| 5,642,078 A | * | 6/1997 | Navabi et al. | 330/253 |
| 6,215,357 B1 | * | 4/2001 | Sakurai | 330/255 |
| 6,377,085 B1 | * | 4/2002 | Giuroiu | 327/66 |
| 7,123,095 B2 | * | 10/2006 | Tsutsui et al. | 330/285 |
| 7,271,662 B2 | * | 9/2007 | Akamine et al. | 330/310 |
| 7,368,992 B2 | * | 5/2008 | Sandquist | 330/264 |

* cited by examiner

*Primary Examiner*—Patricia Nguyen

(57) ABSTRACT

An amplifier includes a differential amplifier stage, a voltage amplification stage and a power output stage. The bias level of the output stage is proportional to current through the voltage amplification stage. The voltage amplification stage includes a current mirror whereby controlled current through a first leg of the current mirror controls current through the remaining, second leg, which, in turn, determines the bias level of the power output stage. Control circuitry senses a parameter of the amplifier, such as DC bias or input signal level to generate a control signal which is applied to the first leg of the current mirror to thereby control bias level of the power output stage.

3 Claims, 2 Drawing Sheets

US 7,545,216 B2

AMPLIFIER WITH CURRENT MIRROR BIAS ADJUST

REFERENCE TO PRIOR APPLICATION

The present application claims the benefit of U.S. provisional application Ser. No. 60/874,200 filed Dec. 12, 2006.

DETAILED DESCRIPTION

Figure 1:
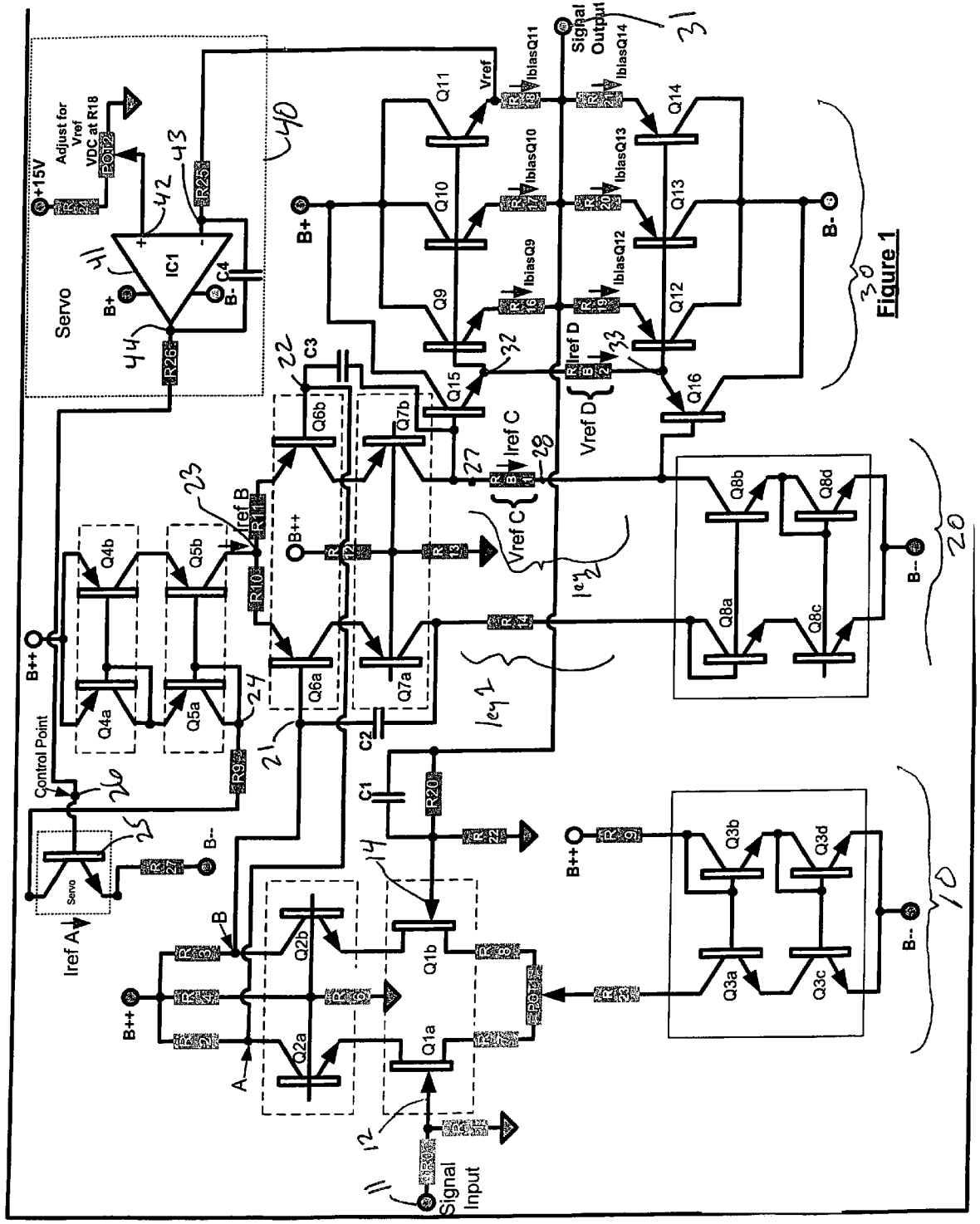

FIG. 1 is a detailed schematic diagram of a power amplifier. The amplifier is comprised of three stages:

A differential amplifier stage, indicated generally at 10
A voltage amplification stage, indicated generally at 20, and
A power output stage, indicated generally at 30.

The differential amplifier stage 10 receives an input signal to-be-amplified at input terminal 11 and, after a slight voltage divider comprised of R0 and R1, passes the input signal to the gate, 12, of Q1a, which is a matched FET dual to transistor Q1b. Received at gate 14 of Q1b is the voltage divided signal, via resistors R20 (with parallel compensation capacitor C1), and R22 at the amplifier output terminal 31. The sources of Q1a and Q1b are connected to source resistors R7 and R8, respectively, which, in turn connect to a DC bias offset potentiometer POT1. The wiper of POT1 connects through a resistor R23 to the collector of a matched transistor quad Q3a-Q3d. As shown, transistors Q3a-Q3d are interconnected to form a current mirror, with the emitters of Q3c and Q3d connected to a source of negative bias voltage, B--. The collector of Q3b connects through resistor R9 to a source of positive bias voltage, B++. The current through R9 is determine by the difference between B++ and B--, minus the base to emitter drops of Q3b and Q3d (approximately 1.4 volts) divided by the value of R9. Since the current in Q3a, Q3c will mirror the current through Q3b, Q3d, the constant current provided through R23 to the Q1a, Q1b differential pair is established.

The drains of the differential pair Q1a, Q1b are connected to the emitters of cascode transistors Q2a, Q2b, respectively. The bases of cascade transistors Q2a, Q2b are fixed biased by a voltage divider comprised of series connected resistors R4, R6, which connect between B++ and ground. The collector of Q2a, designated as point A, is connected through a collector resistor R2 to the positive bias supply B++. The collector of Q2b, designated as point B, connects through a collector resistor R3 to the positive bias supply B++.

Thus, the differential amplifier stage 10 produces differential output signals at points A and B representing the difference between the signal at the amplifier input 11 and the signal at the amplifier output 31.

The differential signals at points A and B are fed to the bases 21, 22 of transistor matched pair Q5a, Q5b respectively, which form the inputs to the voltage amplification stage 20. The emitters of Q5a, Q5b connect through resistors R10, R11, respectively, to a common point 23. Also connected to common point 23 is the collector of transistor Q5b, which is a matched pair to transistor Q5a. The bases of Q5a and Q5b, as well as the collector of Q5a are connected in common at point 24. The emitters of Q5a, Q5b are connected to the respective collectors of transistor matched pair Q4a, Q4a. Preferably, Q4a,b and Q5a,b are all matched transistors. The bases of Q4a and Q4b are connected in common with the collector of Q4a. The emitters of Q4a and Q4b connect to the source of positive bias voltage B++.

Point 24 connects through a resistor R9 to the collector of a control transistor 25. The emitter of control transistor 25 connects through a resistor R27 to the negative bias source B--. The base of transistor 25 is a control point 26. As will be discussed more thoroughly herein below, control circuitry monitors one or more parameters of the amplifier and provides a control signal to control point 26 to control the bias to the power output stage 30.

As can be seen from the connections of Q4a,b and Q5a,b, a current mirror is formed whereby the controlled current out of point 24 will be mirrored as current flow into point 23. The current into point 23 then splits as current into Q6a and Q6b.

In cascode with transistors Q6a and Q6b are matched transistor pair Q7a and Q7b, respectively. The bases of transistor matched pair Q7a and Q7b are connected in common and fixed biased by a voltage divider comprised of resistors R12 and R13 which connect between the positive bias source B++ and ground.

The collectors of Q7a and Q7b connect through resistors R14 and RB1, respectively, to the collectors of a matched transistor pair Q8a and Q8b, respectively. The collector of Q8a connects to the common connection of the bases of Q8a and Q8b. The emitters of Q8a and Q8b connect to the collectors of transistor matched pair Q8c and Q8d, respectively. The bases of Q8c and Q8d are connected in common and to the collector of Q8d. Preferably, transistors Q8a-Q8d are all matched. Transistors Q8a-Q8d, connected as shown, form a precision current mirror whereby the current through R14, which is related to the signal out of point A, is mirrored as a current through bias resistor RB1. The current through bias resistor RB1 is also related to the signal at point B. In this way, the differential output from points A and B is reflected as a differential current signal through RB1.

Shown connected from the base of Q6a to the collector of Q7a is a compensation capacitor C2. Similarly, a compensation capacitor C3 connects from the base of Q6b to the collector of Q7b. The capacitors C1-C3 are adjusted in the normal manner to compensate the amplifier.

As shown, the current through bias resistor RB1 is designated Iref C and it produces a bias voltage Vref C across points 27, 28, which are at opposite ends of bias resistor RB1.

The points 27, 28 represent the output points of the voltage amplification stage 20. Point 27 connects to the bases of emitter follower transistors Q15, Q16. The collectors of transistors Q15 and Q16 connect to a positive bias source B+ and a negative bias source B-, respectively. The emitters of Q15 and Q16 are connected through a second bias resistor RB2, at points 32 and 33, respectively.

Point 32 connects to the bases of three parallel output transistors Q9-Q11. The collectors of Q9-Q11 all connect to the positive bias source B+. The emitters of transistor Q9-Q11 connect through respective emitter resistors R16 through R18 to the amplifier output point 31.

Similarly, point 33 connects to the bases of three parallel output transistors Q12-Q14. The collectors of Q12-Q14 all connect to the negative bias source B-. The emitters of transistor Q12-Q14 connect through respective emitter resistors R19 through R21 to the amplifier output point 31.

In operation, the voltage applied to the control point 26 creates a reference current Iref A through control transistor 25. Due to the current mirror connection of Q4a, Q4b, Q5a and Q5b, a current Iref B is created into point 23. In this, the preferred embodiment of the invention, the current Iref A equals the current Iref B, although Iref B could be deigned to be a fraction, or a multiple of Iref A.

Now, the current Iref B splits between the first leg (leg 1) and the second leg (leg 2) of the voltage amplification stage 20. In general, each leg (leg 1 and leg 2) will carry a current equal to one-half of Iref A. Since the bias of the output transistors Q9-Q14 is directly controlled by the voltage across resistor RB2 which, in turn, is controlled by the voltage across RB1, it can be seen that applying appropriate signals at the control point 26 is a convenient and precise way to control bias current (IbiasQ9-IbiasQ14) of the output transistors Q9-Q14.

While many control circuits could be devised to control output transistor bias current in an advantageous manner, one specific example is illustrated in FIG. 1. Here, a servo circuit 40 comprises an operational amplifier having a non-inverting input 42, an inverting input 43 and an output 44. A resistor R25 connects the inverting input 43 to the emitter of Q11. In this way, the inverting input 43 monitors the voltage Vref which is equal to the bias current through Q11, IbiasQ11, times the value of emitter resistor R18. Assuming a reasonable match of the output transistors Q9-Q14, as further improved by the emitter resistors R16-R21, the voltage Vref is representative of each of the output transistor Q9-Q14 bias currents, IbiasQ9-IbiasQ14.

It is clearly advantageous to be able to control the DC bias levels in the power output stages of an amplifier to minimize distortion, prevent thermal runaway, manage heat dissipation, etc.

A capacitor, C4, connects from the inverting input 43 to the output 44 of operational amplifier 41. The value of capacitor C4 along with the value of resistor R25 are selected to form a low pass filter, so that the voltage appearing at the inverting input 43 is, essentially, the DC voltage across emitter resistor R18.

The operational amplifier 41 has an adjustable DC voltage applied at its non-inverting input 42 which is achieved by connecting the non-inverting input 42 to the wiper of a potentiometer POT2. POT2 has one free end connected to ground and the other free end connected through a dropping resistor R24 to the positive bias source B+. The values for POT2 and R24 are selected based upon the desired operating range of the output transistor Q9-Q14 bias current.

The output 44 of operational amplifier 41 connects through resistor R26 to the control point 26, which is the base of control transistor 25. The emitter of control transistor 25 connects to the negative bias source B—through resistor R27.

In operation, POT2 is adjusted to apply a voltage Vref to the non-inverting input 42 which is the desired bias voltage and corresponds to the desired bias current through the output transistor Q11. When the amplifier is first turned on, a positive voltage will appear at the non-inverting input 42 of operational amplifier 41. This will result in operational amplifier 41 producing a positive voltage at its output 44, which will increase the voltage at control point 26 and increase the current Iref A through control transistor 25. An increasing I ref A will, as described above, produce an increasing I ref B and Iref C, thereby increasing the bias current IbiasQ11 in output transistor Q11. The bias current IbiasQ11 will continue to increase until the voltage at the inverting input 43 equals the voltage at the non-inverting input 42 of operational amplifier 41 such that operational amplifier 41 will produce a signal at its output 44 which, when applied to control terminal 25 will maintain the bias current through Q11, and, thus, all of the other output transistors at the desired bias level as set by POT2.

Figure 2:
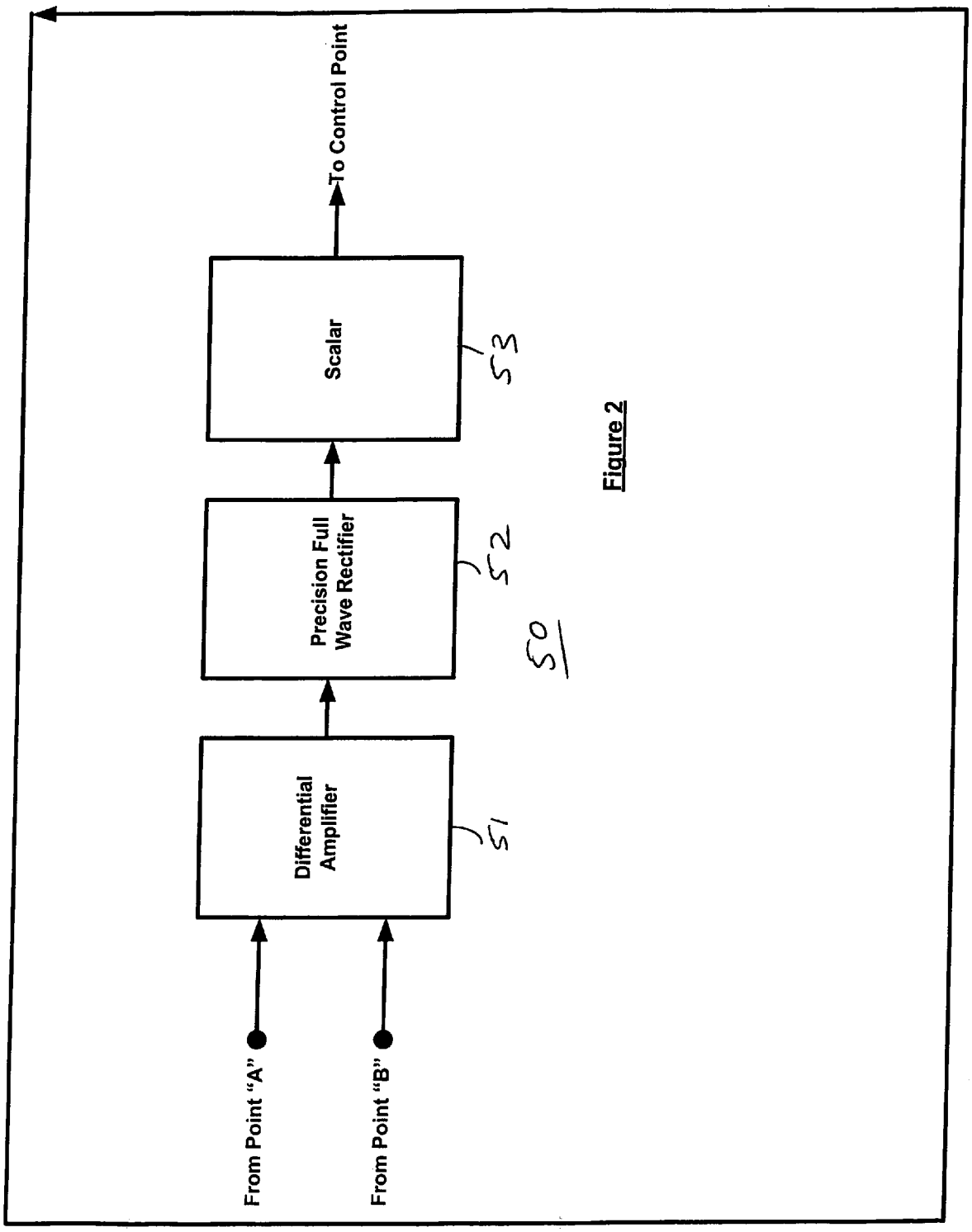

FIG. 2 illustrates an alternative use of the novel output bias scheme, indicated generally at 50, according to the present invention. Here, the basic amplifier construction of FIG. 1 is assumed, minus the servo circuit 40. The differential signals from points A and B of FIG. 1 are fed to a differential amplifier 51, which in turn connects to a precision full wave rectifier circuit 52. Thus, the output from precision full wave rectifier circuit 52 is a DC voltage having an instantaneous peak level representative of the instantaneous input signal to the amplifier at input 11 of FIG. 1. This instantaneous peak level is then processed through a scalar circuit 53 and applied as the control voltage to control point 26 of FIG. 1.

By appropriate design of the differential amplifier 51, precision full wave rectifier 52 and scalar 53, the bias of the output stage 30 in FIG. 1 can be set to be biased in a dynamic class A mode. By "dynamic class A mode", it is meant that the bias current level of the output stage 30 can be at low levels when no signal is applied to the amplifier at input 11, to thereby maintain low power dissipation. However, the control circuit 50 of FIG. 2 is designed to track the peak level of an input signal applied at amplifier input 11 such that the output transistors Q9-Q14 never turn completely off, thereby avoiding undesired crossover distortion.

There are numerous other ways to configure control circuits which apply a control signal to the control point to control the bias of the power output stage of an amplifier. For example, whereas the embodiment in FIG. 1 just senses bias current through output transistor Q11, it is well within the scope of this invention to use a conventional summing circuit, with inverters as appropriate, to monitor the bias current through all of the output transistors Q9-Q14 and thereby produce the control signal. In addition, the desired control circuit could combine both the DC bias servo 40 of FIG. 1 with the dynamic class A bias control circuit of FIG. 2 to control both DC and dynamic bias of the output stage 30. Numerous other approaches to control circuitry will be obvious to those of ordinary skill in the art in view of the teaching set forth herein.

I claim:

1. An amplifier including:
   a differential amplifier stage,
   a voltage amplification stage, and
   a power output stage,
   wherein:
   a) the bias level of the output stage is proportional to current through the voltage amplification stage, and
   b) the voltage amplification stage includes a current mirror whereby controlled current through a first leg of the current mirror controls current through the remaining, second leg, which, in turn, determines the bias level of the power output stage,
   the amplifier further including control circuitry for sensing a parameter of the amplifier to generate a control signal which is applied to the first leg of the current mirror to thereby control bias level of the power output stage.

2. The amplifier of claim 1 wherein the control circuitry senses DC bias of the power output stage to generate a control signal which is applied to the first leg of the current mirror to thereby control bias level of the power output stage.

3. The amplifier of claim 1 wherein the control circuitry senses input signal level to generate a control signal which is applied to the first leg of the current mirror to thereby control bias level of the power output stage.

* * * * *